United States Patent
Lin et al.

(10) Patent No.: US 10,379,169 B2
(45) Date of Patent: Aug. 13, 2019

(54) BATTERY CAPACITY ESTIMATING APPARATUS AND BATTERY CAPACITY ESTIMATING METHOD THEREOF

(71) Applicants: Tatung Company, Taipei (TW); TATUNG UNIVERSITY, Taipei (TW)

(72) Inventors: Chang-Hua Lin, Taipei (TW); Min-Hsuan Hung, Taipei (TW)

(73) Assignees: TATUNG COMPANY, Taipei (TW); TATUNG UNIVERSITY, Taipei (TW)

( * ) Notice: Subject to any disclaimer, the term of this patent is extended or adjusted under 35 U.S.C. 154(b) by 693 days.

(21) Appl. No.: 14/642,771

(22) Filed: Mar. 10, 2015

(65) Prior Publication Data

US 2016/0169975 A1 Jun. 16, 2016

(30) Foreign Application Priority Data

Dec. 10, 2014 (TW) .............................. 103143028 A

(51) Int. Cl.
| | |
|---|---|
| *G01R 31/36* | (2019.01) |
| *G01R 31/392* | (2019.01) |
| *G01R 31/389* | (2019.01) |
| *G01R 31/3842* | (2019.01) |

(52) U.S. Cl.
CPC ......... *G01R 31/392* (2019.01); *G01R 31/389* (2019.01); *G01R 31/3842* (2019.01)

(58) Field of Classification Search
CPC .......................... G01R 31/3648; G01R 31/361
USPC ...................................................... 702/63–65
See application file for complete search history.

(56) References Cited

U.S. PATENT DOCUMENTS

| | | | | |
|---|---|---|---|---|
| 6,310,462 | B1 * | 10/2001 | Arai .................... | G01R 31/3624 320/132 |
| 7,352,156 | B2 * | 4/2008 | Ashizawa ............ | G01R 31/361 320/132 |
| 8,232,770 | B2 | 7/2012 | Okumura | |
| 8,275,562 | B2 | 9/2012 | Su et al. | |
| 8,918,300 | B2 * | 12/2014 | Baba .................. | G01R 31/3624 702/63 |

FOREIGN PATENT DOCUMENTS

| | | |
|---|---|---|
| CN | 103364736 | 10/2013 |
| TW | 297098 | 2/1997 |
| TW | 200928404 | 7/2009 |
| TW | 201145759 | 12/2011 |
| TW | I411796 | 10/2013 |
| TW | 201346303 | 11/2013 |
| TW | I444639 | 7/2014 |

OTHER PUBLICATIONS

The free Dictionary.com, https://www.thefreedictionary.com/Perturbation+methods.*
Introduction to Preturbantation Techniques by Ali Hasan Nayfeh_ Published 1993 http://salimpour.iut.ac.ir/sites/salimpour.iut.ac.ir/files/files_course/introduction_to_perturbation_techniques_nayfeh_0471310131.pdf.*
"Office Action of Taiwan Counterpart Application", dated Nov. 4, 2015, p. 1-p. 5, in which the listed reference as cited.

* cited by examiner

*Primary Examiner* — Gene N Auduong
(74) *Attorney, Agent, or Firm* — JCIPRNET

(57) ABSTRACT

A battery capacity estimating apparatus and a battery capacity estimating method of the battery capacity detecting apparatus are provided. A state of charge and a state of health of a battery are calculated according to dynamic impedance of the battery.

8 Claims, 4 Drawing Sheets

BATTERY CAPACITY ESTIMATING APPARATUS AND BATTERY CAPACITY ESTIMATING METHOD THEREOF

CROSS-REFERENCE TO RELATED APPLICATION

This application claims the priority benefit of Taiwan application serial no. 103143028, filed on Dec. 10, 2014. The entirety of the above-mentioned patent application is hereby incorporated by reference herein and made a part of this specification.

FIELD OF THE INVENTION

The invention relates to an estimating apparatus; more particularly, the invention relates to a real-time estimating apparatus that estimates a state of charge (SOC) and a state of health (SOH) of a battery and an estimating method of the real-time estimating apparatus.

DESCRIPTION OF RELATED ART

Batteries can be extensively applied to various fields, such as electronic apparatuses (e.g., mobile phones, notebook computers, etc.), electronic vehicles (e.g., hybrid vehicles, electric cars, electric buses, electric motorcycles, etc.), and so on. When a battery is actually applied, whether accurate information regarding the capacity of the battery can be provided to a user or technical staff is rather crucial. The capacity of the battery may represent the power left in the battery (the residual capacity of the battery), the power that is already consumed (the discharged capacity of the battery), or the degradation level of the maximum capacity of the battery (the aging state of the battery). The residual capacity of the battery may be calculated by subtracting the discharged capacity of the battery from the maximum capacity of the battery; as long as the discharged capacity of the battery and the maximum capacity of the battery are obtained, the residual capacity of the battery can be estimated. Here, the maximum capacity of the battery can be calculated by subtracting the degradation level of the maximum capacity of the battery from the nominal capacity of the battery prior to delivery.

The capacity of the battery can be represented by the state of charge (SOC) in unit of percentage within a range from 0% (fully discharged) to 100% (fully charged). Under the above-mentioned circumstances, said percentage may stand for the ratio of the residual capacity to the full capacity of the battery. If the battery is brand new, the full capacity of the battery may be equal to the nominal capacity (i.e., the rated capacity) of the battery; after the battery is continuously used and aged, the full capacity may be less than the nominal capacity. That is, the same SOC may represent different capacities of the battery; thereby, the user is not able to learn the actual available capacity of the battery, which may cause inconvenience to the user. At present, the existing methods of estimating the capacity of the battery all require historical data regarding the initial capacity of the battery as well as charging and discharging actions which are already performed. Hence, how to estimate the up-to-date capacity of the battery and the full capacity of the battery in an efficient and accurate manner has become an important issue.

SUMMARY OF THE INVENTION

The invention is directed to a battery capacity estimating apparatus and a battery capacity estimating method thereof for estimating an up-to-date state of charge (SOC) and an up-to-date state of health (SOH) of a battery in a real-time and accurate manner, and no historical data regarding an initial capacity of the battery as well as charging and discharging actions which are already performed are required.

In an embodiment of the invention, a battery capacity estimating apparatus that includes a detection unit and an estimating unit is provided. The detection unit detects a voltage and a current of a battery. The estimating unit is coupled to the detection unit. According to a detection result of the detection unit, the estimating unit calculates dynamic impedance of the battery and a variation in a capacity of the battery; according to the dynamic impedance and the variation in the capacity of the battery, the estimating unit calculates an SOC and an SOH of the battery.

According to an embodiment of the invention, a correlation between the capacity of the battery and the dynamic impedance can be approximated to a parabola. After the estimating unit differentiates the parabola, the estimating unit obtains a one-to-one functional relationship of the capacity of the battery to a quotient obtained by dividing a variation in the dynamic impedance by the variation in the capacity of the battery, and the one-to-one functional relationship is expressed by a straight line on a coordinate plane.

According to an embodiment of the invention, the estimating unit further calculates the up-to-date SOC of the battery according to the quotient obtained by dividing the variation in the dynamic impedance by the variation in the capacity of the battery.

According to an embodiment of the invention, the estimating unit further calculates a slope of the straight line and calculates the SOH of the battery according to the slope of the straight line.

According to an embodiment of the invention, the variation in the capacity of the battery is $$\frac{1}{2} \times \frac{(I_1 + I_2) \times \Delta t}{Q},$$

Q is a rated capacity of the battery, $I_1$ and $I_2$ are currents obtained by detecting two adjacent sampling points of the battery, and $\Delta t$ is a time difference between the two sampling points.

In an embodiment of the invention, a capacity estimating method includes following steps. A voltage and a current of a battery are detected. Dynamic impedance and a variation in a capacity of the battery are calculated according to a detection result of the voltage and the current. An SOC and an SOH of a battery are calculated according to the dynamic impedance and the variation in the capacity of the battery.

According to an embodiment of the invention, a correlation between the capacity of the battery and the dynamic impedance can be approximated to a parabola. After the estimating unit differentiates the parabola, the estimating unit obtains a one-to-one functional relationship of the capacity of the battery to a quotient obtained by dividing a variation in the dynamic impedance by the variation in the capacity of the battery, and the one-to-one functional relationship is expressed by a straight line on a coordinate plane.

According to an embodiment of the invention, the step of calculating the SOC of the battery according to the dynamic impedance and the variation in the capacity of the battery includes calculating the SOC of the battery according to the quotient obtained by dividing the variation in the dynamic impedance by the variation in the capacity of the battery.

According to an embodiment of the invention, the step of calculating the SOH of the battery according to the dynamic impedance and the variation in the capacity of the battery includes calculating the SOH according to a slope of the straight line.

In view of the above, in an embodiment of the invention, the SOC and the SOH of the battery are calculated according to the dynamic impedance of the battery and the variation in the capacity of the battery; thereby, the SOC and the SOH of the battery may be estimated in a real-time and accurate manner in no need of the initial capacity of the battery and the historical data regarding the charging and discharging actions that are already performed.

Several exemplary embodiments accompanied with figures are described in detail below to further describe the invention in details.

DETAILED DESCRIPTION OF DISCLOSED EMBODIMENTS

Figure 1:
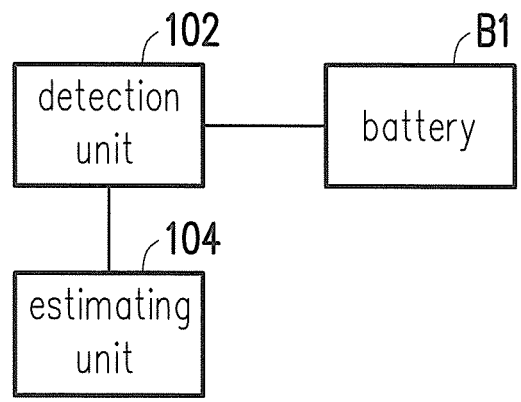
FIG. 1 is a schematic view illustrating a battery capacity estimating apparatus according to an embodiment of the invention.

FIG. 1 is a schematic view illustrating a battery capacity estimating apparatus according to an embodiment of the invention. As shown in FIG. 1, the battery capacity estimating apparatus includes a detection unit 102 and an estimating unit 104, and the detection unit 102 is coupled to the estimating unit 104 and a battery B1. The detection unit 102 may apply a perturbation technique to the battery B1 and measures a voltage and a current of the battery B1. The estimating unit 104 may calculate dynamic impedance of the battery and a variation in a capacity of the battery B1 corresponding to the up-to-date capacity of the battery B1 according to a detection result of the detection unit 102 and calculate a state of charge (SOC) and a state of health (SOH) of the battery B1 according to the dynamic impedance and the variation in the capacity of the battery B1. Here, the SOH of the battery B1 represents the maximum capacity of the battery B1, and the dynamic impedance can be obtained by dividing a variation in the voltage of the battery by a variation in the current of the battery.

Figure 2:
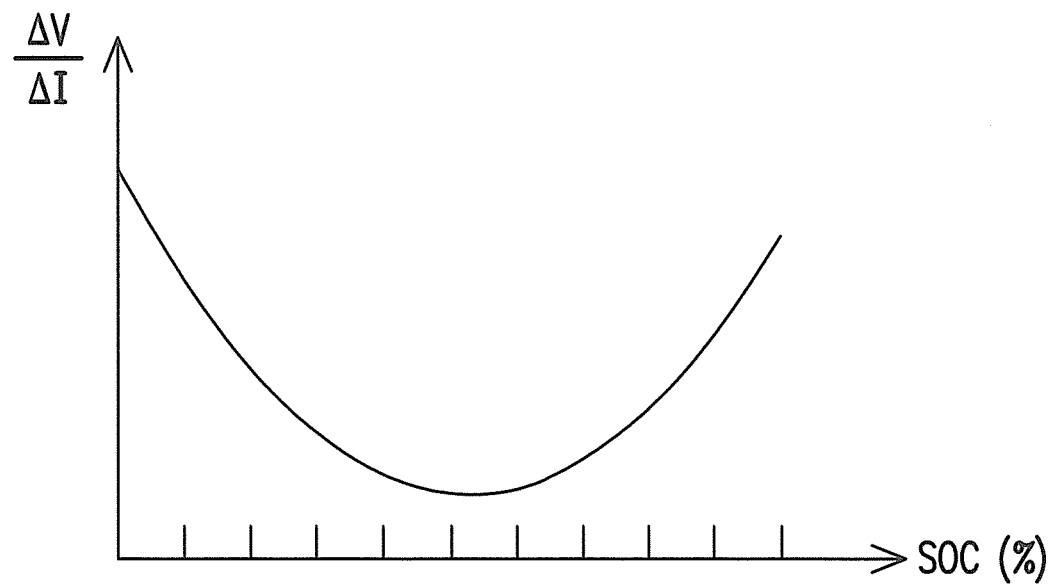
FIG. 2 and FIG. 3 are schematic views illustrating a characteristic curve of a battery according to an embodiment of the invention.
Figure 3:
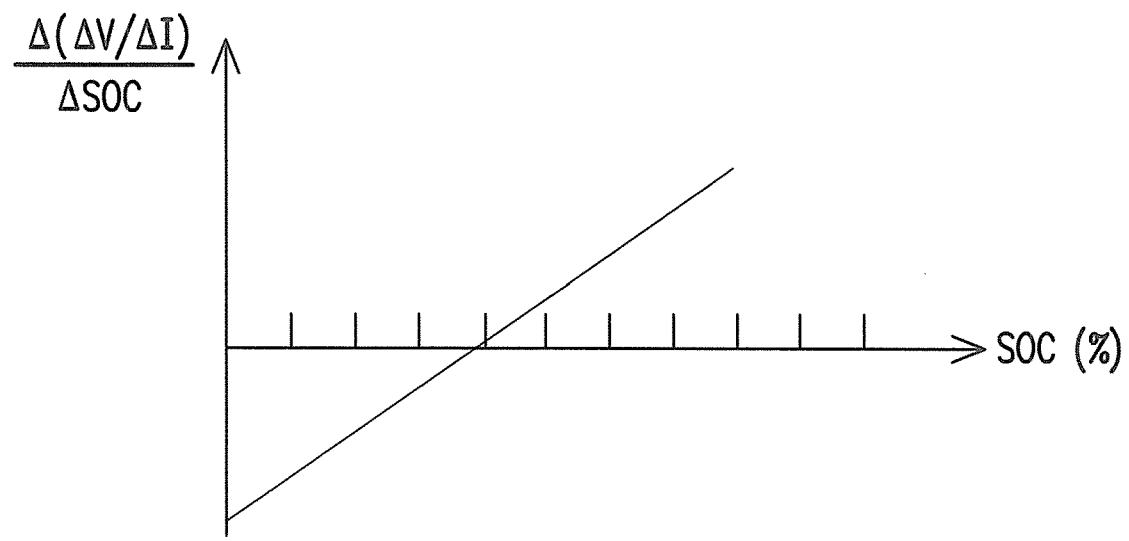

For instance, FIG. 2 and FIG. 3 are schematic views illustrating a characteristic curve of a battery according to an embodiment of the invention. As shown in FIG. 2 and FIG. 3, in the present embodiment of the invention, a correlation between the SOC of the battery and the dynamic impedance (ΔV/ΔI) can be approximated to a parabola. After the parabola is differentiated, a one-to-one functional relationship of the capacity of the battery B1 to a quotient obtained by dividing a variation in the dynamic impedance by the variation in the capacity of the battery B1 can be obtained, and the one-to-one functional relationship may be expressed by a straight line on a coordinate plane. The estimating unit 104 may calculate the SOC of the battery B1 according to the quotient obtained by dividing the variation in the dynamic impedance by the variation in the capacity of the battery B1. Besides, the estimating unit may further calculate a slope of the straight line shown in FIG. 3 and calculate the state of health (SOH) of the battery B1 according to the slope of the straight line.

Particularly, a correlation between the SOC of the battery and the dynamic impedance (ΔV/ΔI) of a lithium battery (i.e., the parabola shown in FIG. 2) may be approached by an equation (1) below:

$$\frac{\Delta V}{\Delta I} = a(SOC)^2 + b(SOC) + C \qquad (1)$$

Here, a, b, and c are coefficients and are real numbers, and SOC stands for the state of charge of the battery B1. The dynamic impedance becomes greater when the battery B1 with larger capacity or smaller capacity. In addition, the dynamic impedance of the battery which is aging to a greater extent is greater than the dynamic impedance of the battery which is aging to a less extent, and the dynamic impedance of the battery which is aging to a greater extent corresponds to the relatively large coefficient a. If the equation (1) is applied to differentiate the SOC of the battery B1, the straight line shown in FIG. 3 can obtained and approached by an equation (2):

$$\frac{\Delta(\Delta V/\Delta I)}{\Delta SOC} = 2a(SOC) + b \qquad (2)$$

The SOC of the battery B1 can be derived from and approached by an equation (3):

$$SOC = \left[\frac{\Delta(\Delta V/\Delta I)}{\Delta SOC} - b\right]/2a \qquad (3)$$

Figure 4:
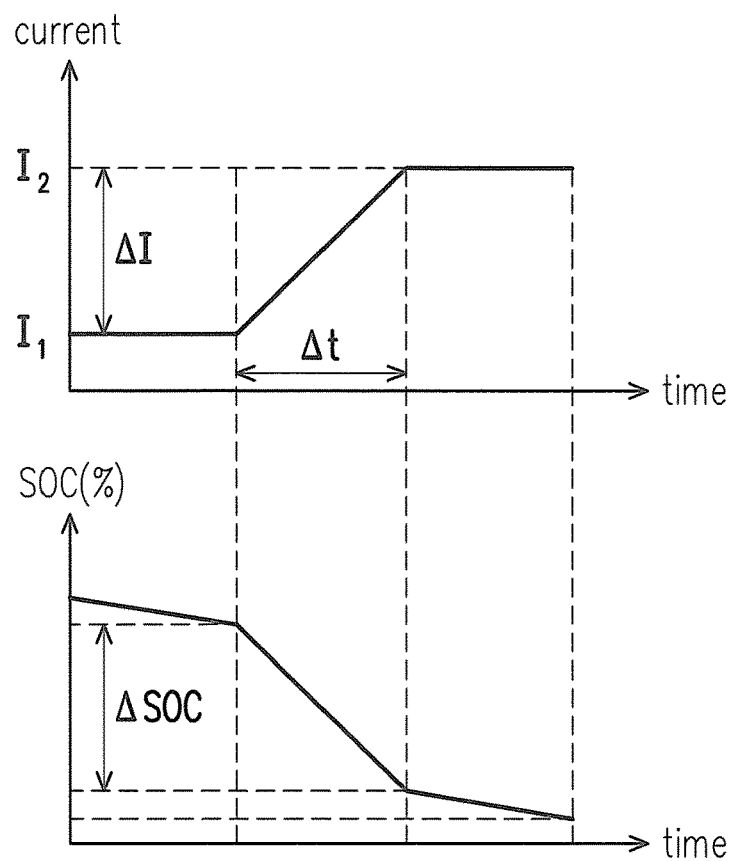
FIG. 4 is a schematic view illustrating a variation in a current of a battery and a variation in a capacity of the battery according to an embodiment of the invention.

As long as the calculation result of Δ(ΔV/ΔI)/ΔSOC is obtained, the corresponding SOC of the battery B1 can be learned, and the method of calculating the coefficients a and b will be described hereinafter. A variation (ΔSOC) in the capacity of the battery B1 can be calculated by applying a coulomb counting method, for instance, and a variation in a current of the battery B1 and the variation in the capacity of the battery B1 are schematically shown in FIG. 4. The variation (ΔSOC) in the capacity of the battery B1 can be obtained by an equation (4):

$$\Delta SOC = \frac{1}{2} \times \frac{(I_1 + I_2) \times \Delta t}{Q} \qquad (4)$$

Here, Q is a rated capacity of the battery B1, $I_1$ and $I_2$ are currents obtained by detecting two adjacent sampling points of the battery B1, and Δt is a time difference between the two sampling points. Hence, the variation (ΔSOC) in the capacity of the battery B1 can be obtained by the equation (4).

In addition, the coefficient a in the equation (3) can be calculated by applying the equation (2) to further differentiate the SOC of the battery B1 and can be expressed by an equation (5):

$$a = \frac{1}{2} \times \frac{\Delta[\Delta(\Delta V / \Delta I)]}{\Delta[\Delta SOC]} \quad (5)$$

Figure 5:
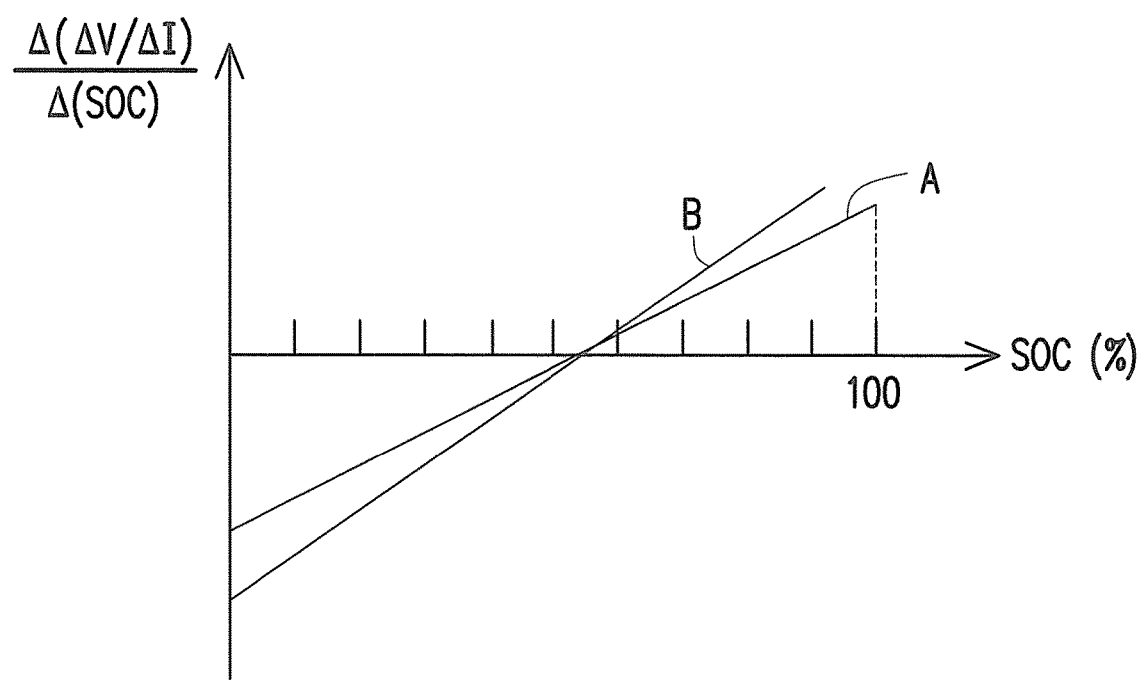
FIG. 5 is a schematic view illustrating a characteristic curve of a battery according to another embodiment of the invention.

FIG. 5 is a schematic view illustrating a characteristic curve of a battery according to another embodiment of the invention. As shown in FIG. 5, the line segment A is a characteristic curve in case that the battery B1 is brand new, and the line segment B is a characteristic curve in case that the battery B1 is in the current state. According to the present embodiment, it is assumed that the battery B1 is aging, and thus the slope of the line segment B is greater than that of the line segment A. The line segment A may be expressed by an equation (6):

$$\frac{\Delta(\Delta V / \Delta I)}{\Delta SOC} = 2a'(SOC) + b' \quad (6)$$

Here, a' and b' are coefficients and real numbers. Since the line segment A is a characteristic curve in case that the battery B1 is on a brand new condition, a' and b' are known coefficients. Given that the coefficients a, a', and b' are all known coefficients, the coefficient b can be obtained by solving simultaneous equations (2) and (6) and can be expressed by an equation (7):

$$b = \frac{b'(a - a')}{2a} \quad (7)$$

In another perspective, it can be learned from FIG. 5 that the length of the line segment A is the same as that of the line segment B; hence, the correlation between the SOH of the battery B1 in the current state and the SOH' of the battery B1 on the brand new condition can be shown by an equation (8):

$$\frac{SOH}{SOH'} = \frac{\cos(\tan^{-1} 2a)}{\cos(\tan^{-1} 2a')} \quad (8)$$

Here, 2a' and 2a are respectively the slope of the line segment A and the slope of the line segment B. If the SOH' of the battery B1 on the brand new condition is defined as 100%, the SOH of the battery B1 can be expressed by an equation (9):

$$SOH = \frac{\cos(\tan^{-1} 2a)}{\cos(\tan^{-1} 2a')} \times 100\% \quad (9)$$

In light of the foregoing, in an embodiment of the invention, the SOC and the SOH of the battery are calculated according to the dynamic impedance of the battery and the variation in the capacity of the battery; thereby, the SOC and the SOH of the battery may be estimated in a real-time and accurate manner in no need of the initial capacity of the battery and the historical data regarding the charging and discharging actions that are already performed. Although the battery B1 provided in the previous embodiments is a lithium battery, for instance, note that the battery B1 is not limited to those described above and may be any other battery, e.g., any rechargeable battery (secondary battery).

Figure 6:
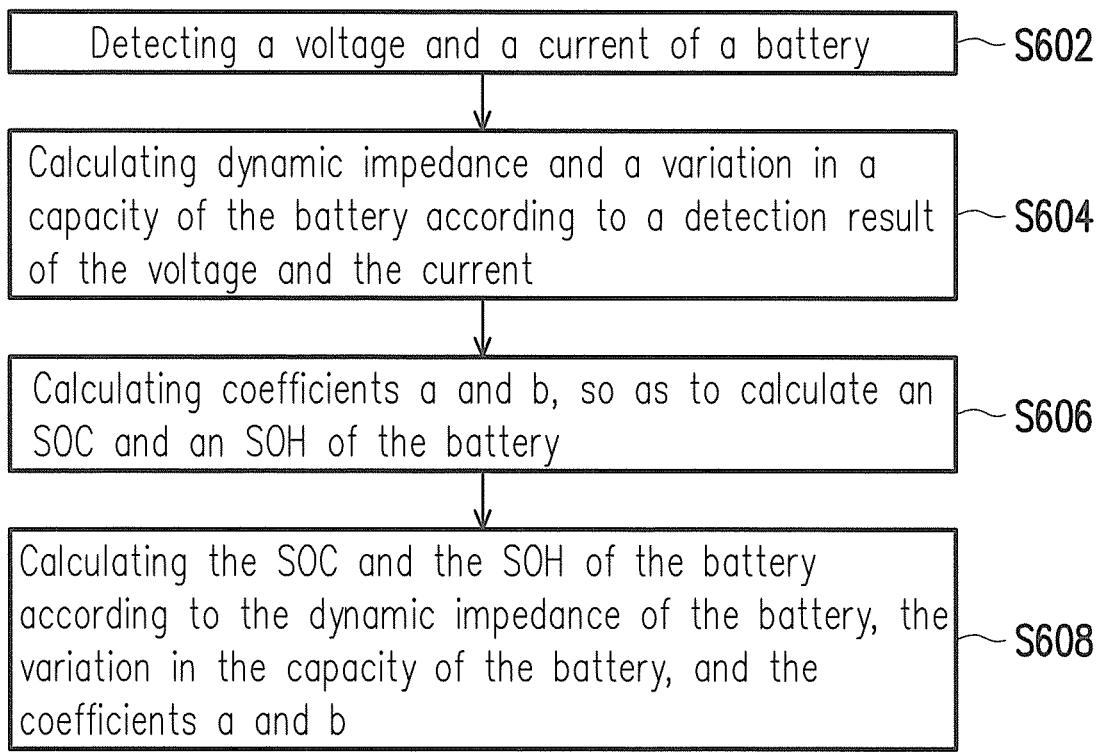
FIG. 6 is a schematic flowchart of a battery capacity estimating method according to an embodiment of the invention.

FIG. 6 is a schematic flowchart of a battery capacity estimating method according to an embodiment of the invention. With reference to FIG. 6, the battery capacity estimating method of the battery capacity estimating apparatus (provided in the previous embodiments) may include following steps. A voltage and a current of a battery are detected (step S602). Dynamic impedance and a variation in a capacity of the battery are calculated according to a detection result of the voltage and the current (step S604). Here, a correlation between the capacity of the battery and the dynamic impedance is expressed by a parabola, and the correlation between the capacity of the battery and the quotient obtained by dividing a variation in the dynamic impedance by the variation in the capacity of the battery can be approximated to a straight line on a coordinate plane. Coefficients a and b are then calculated, so as to calculate an SOC and an SOH of the battery (step S606). The method of calculating the SOC and the SOH is already elaborated in the previous embodiments and thus will not be further described hereinafter. The SOC and the SOH of the battery are calculated according to the dynamic impedance of the battery, the variation in the capacity of the battery, and the coefficients a and b (step S608). For instance, the SOC of the battery can be calculated by dividing the variation in the dynamic impedance by the variation in the capacity of the battery, and the SOH of the battery can be calculated according to the slope of the straight line. Here, the variation in the capacity of the battery can be calculated by the equation (4), for instance.

To sum up, in an embodiment of the invention, the SOC and the SOH of the battery are calculated according to the dynamic impedance of the battery and the variation in the capacity of the battery; thereby, the SOC and the SOH of the battery may be estimated in a real-time and accurate manner in no need of the initial capacity of the battery and the historical data regarding the charging and discharging actions that are already performed. Thereby, a user is able to learn the actual available capacity of the battery instantly and accurately. Besides, the battery capacity estimating apparatus provided in an embodiment of the invention is further characterized by small volume and low costs. The battery capacity estimating apparatus can be arranged at a large power charging station or a battery exchange station not only to estimate the capacity of the battery efficiently but also to assist manufacturers and consumers in detecting the failed or aging battery. In another example, the battery of an electric vehicle can be detected, such that the aging battery with the reduced power storage can be efficiently detected during maintenance or repair. The battery with the reduced power storage can be replaced, and the replaced battery can be still used by a power storage system. That is, the apparatus described herein can be applied to a battery recycling supply chain, so that the battery can be recycled and re-used.

What is claimed is:

1. A battery capacity estimating apparatus for real-time determining battery performance, comprising:
   a detection unit detecting a voltage variation and a current variation of a battery as a detection result; and
   an estimating unit coupled to the detection unit, wherein the estimating unit calculates dynamic impedance of the battery and a variation in a capacity of the battery according to the detection result provided by the detection unit, and the estimating unit determines a state of charge and a state of health of the battery according to the dynamic impedance of the battery and the variation in the capacity of the battery,
wherein the state of charge of the battery is $$SOC = \left[\frac{\Delta(\Delta V/\Delta I)}{\Delta SOC} - b\right] \Big/ 2a$$

a characteristic curve equation of the battery on a brand new condition is $$\frac{\Delta(\Delta V/\Delta I)}{\Delta SOC} = 2a'(SOC) + b',$$

$\Delta V$ is the voltage variation of the battery, $\Delta I$ is the current variation of the battery, $\Delta V/\Delta I$ is the dynamic impedance of the battery, $\Delta SOC$ is the variation in the capacity of the battery, coefficients a' and b' are known real numbers, and coefficients a and b are calculated by an equation:

$$a = \frac{1}{2} \times \frac{\Delta[\Delta(\Delta V/\Delta I)]}{\Delta[\Delta SOC]}$$
$$b = \frac{b'(a-a')}{2a}.$$

wherein the state of charge and the state of health of the battery are battery performance parameters for battery recycling management.

2. The battery capacity estimating apparatus according to claim 1, wherein a correlation between the capacity of the battery and the dynamic impedance is expressed by a parabola, after the estimating unit differentiates the parabola, the estimating unit obtains a one-to-one functional relationship of the capacity of the battery to a quotient obtained by dividing a variation in the dynamic impedance by the variation in the capacity of the battery, and the one-to-one functional relationship is expressed by a straight line on a coordinate plane.

3. The battery capacity estimating apparatus according to claim 2, wherein the estimating unit further calculates a slope of the straight line and calculates the state of health of the battery according to the slope of the straight line.

4. The battery capacity estimating apparatus according to claim 1, wherein the variation in the capacity of the battery is $$\frac{1}{2} \times \frac{(I_1 + I_2) \times \Delta t}{Q},$$

Q is a rated capacity of the battery, $I_1$ and $I_2$ are currents obtained by detecting two adjacent sampling points of the battery, and $\Delta t$ is a time difference between the two sampling points.

5. A battery capacity estimating method for real-time determining battery performance, comprising:
   detecting a voltage variation and a current variation of a battery as a detection result;
   calculating dynamic impedance of the battery and a variation in a capacity of the battery according to the detection result; and
   determining a state of charge and a state of health of a battery according to the dynamic impedance of the battery and the variation in the capacity of the battery,
wherein the state of charge of the battery is $$SOC = \left[\frac{\Delta(\Delta V/\Delta I)}{\Delta SOC} - b\right] \Big/ 2a,$$

a characteristic curve equation of the battery on a brand new condition is $$\frac{\Delta(\Delta V/\Delta I)}{\Delta SOC} = 2a'(SOC) + b',$$

$\Delta V$ is the voltage variation of the battery, $\Delta I$ is the current variation of the battery, $\Delta V/\Delta I$ is the dynamic impedance of the battery, $\Delta SOC$ is the variation in the capacity of the battery, coefficients a' and b' are known real numbers, and coefficients a and b are calculated by an equation:

$$a = \frac{1}{2} \times \frac{\Delta[\Delta(\Delta V/\Delta I)]}{\Delta[\Delta SOC]}, b = \frac{b'(a-a')}{2a},$$

wherein the state of charge and the state of health of the battery are battery performance parameters for battery recycling management.

6. The battery capacity estimating method according to claim 5, wherein a correlation between the capacity of the battery and the dynamic impedance is expressed by a parabola, after the parabola is differentiated, an one-to-one functional relationship of the capacity of the battery to a quotient obtained by dividing a variation in the dynamic impedance by the variation in the capacity of the battery is obtained, and the one-to-one functional relationship is expressed by a straight line on a coordinate plane.

7. The battery capacity estimating method according to claim 5, wherein the step of calculating the state of health of the battery according to the dynamic impedance and the variation in the capacity of the battery comprises:
   calculating the state of health of the battery according to a slope of the straight line, and the state of health of the battery is $$SOH = \frac{\cos(\tan^{-1} 2a)}{\cos(\tan^{-1} 2a')} \times 100\%.$$

8. The battery capacity estimating method according to claim 5, wherein the variation in the capacity of the battery is $$\frac{1}{2} \times \frac{(I_1 + I_2) \times \Delta t}{Q},$$

Q is a rated capacity of the battery, $I_1$ and $I_2$ are currents obtained by detecting two adjacent sampling points of the battery, and $\Delta t$ is a time difference between the two sampling points.

* * * * *